US008421323B2

(12) United States Patent
Park et al.

(10) Patent No.: US 8,421,323 B2
(45) Date of Patent: Apr. 16, 2013

(54) LIGHT BLOCKING LAYER, DISPLAY FILTER HAVING THE LIGHT BLOCKING LAYER, AND DISPLAY APPARATUS HAVING THE DISPLAY FILTER

(75) Inventors: Dae Chul Park, Suwon-si (KR); Jin Seo, Daejeon (KR); Jae Young Choi, Seoul (KR); Tae Soon Park, Suwon-si (KR); Jin Woo Yeo, Seoul (KR)

(73) Assignee: Samsung Corning Precision Materials Co., Ltd., Gyeongsangbuk-do (KR)

( * ) Notice: Subject to any disclaimer, the term of this patent is extended or adjusted under 35 U.S.C. 154(b) by 0 days.

(21) Appl. No.: 11/646,431

(22) Filed: Dec. 28, 2006

(65) Prior Publication Data
US 2007/0152555 A1 Jul. 5, 2007

(30) Foreign Application Priority Data

Dec. 30, 2005 (KR) ........................ 10-2005-0135807

(51) Int. Cl.
*H01J 61/40* (2006.01)
*H01J 5/16* (2006.01)
*H01J 1/30* (2006.01)
(52) U.S. Cl.
USPC ........................................ 313/112; 313/311
(58) Field of Classification Search ................. 313/112, 313/494–512; 315/169.3, 169.4; 257/40, 257/79, 98; 428/690, 917; 345/30, 36, 40, 345/45; 282/181.1, 194
See application file for complete search history.

(56) References Cited

U.S. PATENT DOCUMENTS

| | | | | |
|---|---|---|---|---|
| 6,140,768 | A * | 10/2000 | Kim | 313/584 |
| 6,373,191 | B1 * | 4/2002 | Jang et al. | 313/582 |
| 6,657,387 | B1 | 12/2003 | Yoo | |
| 6,787,976 | B2 * | 9/2004 | Minoura et al. | 313/110 |
| 2002/0050783 | A1 * | 5/2002 | Kubota et al. | 313/495 |
| 2003/0007341 | A1 * | 1/2003 | Shimamura et al. | 361/816 |
| 2003/0094296 | A1 * | 5/2003 | Kojima et al. | 174/35 MS |
| 2004/0263039 | A1 * | 12/2004 | Takei et al. | 313/110 |

FOREIGN PATENT DOCUMENTS

| | | |
|---|---|---|
| EP | 1 677 336 A2 | 7/2006 |
| JP | 10-051183 | 2/1998 |

(Continued)

OTHER PUBLICATIONS

European Office Action issued in European Patent Application No. EP 06 12 7355, dated May 4, 2009.

(Continued)

*Primary Examiner* — Anh Mai
*Assistant Examiner* — Elmito Breval
(74) *Attorney, Agent, or Firm* — McDermott Will & Emery LLP (57) ABSTRACT

An external light-shielding layer, a display filter including the external light-shielding layer and a display apparatus including the display filter to enhance brightness, a viewing angle, and a contrast ratio. The external light-shielding layer including: a base substrate including a transparent resin; and wedge-shaped light-shielding patterns spaced apart from each other in a surface of the base substrate at predetermined intervals, and made of a resin including a coloring agent having a concentration of about 0.5% to about 1.5% by weight.

11 Claims, 9 Drawing Sheets

FOREIGN PATENT DOCUMENTS

| | | |
|---|---|---|
| JP | 2001-102792 | 4/2001 |
| JP | 2003058071 A * | 2/2003 |
| JP | 2003066206 A * | 3/2003 |
| JP | 2004-286996 | 10/2004 |
| JP | 286996 * | 10/2004 |
| JP | 2005-084476 | 3/2005 |
| JP | 2005-084477 | 3/2005 |
| JP | 2005-338270 | 12/2005 |
| JP | 2005338270 A * | 12/2005 |

OTHER PUBLICATIONS

Japanese Office Action issued in Japanese Patent Application No. 2006-356188, mailed Dec. 8, 2010.

Japanese Office Action issued Apr. 6, 2010 in corresponding JP Appln. 2006-356188.

* cited by examiner

LIGHT BLOCKING LAYER, DISPLAY FILTER HAVING THE LIGHT BLOCKING LAYER, AND DISPLAY APPARATUS HAVING THE DISPLAY FILTER

CROSS-REFERENCE TO RELATED APPLICATION

This application claims the benefit of Korean Patent Application No. 10-2005-0135807, filed on Dec. 30, 2005, in the Korean Intellectual Property Office, the disclosure of which is incorporated herein by reference.

BACKGROUND OF THE INVENTION

1. Field of the Invention

The present invention relates to an external light-shielding layer, a display filter including the external light-shielding layer, and a display apparatus including the display filter. More particularly, the present invention relates to an external light-shielding layer which can raise a contrast ratio in a bright room, enhance brightness, and increase a viewing angle, a display filter including the external light-shielding layer, and a display apparatus including the display filter.

2. Description of Related Art

As modern society becomes more information oriented, technology of parts and devices related to image displays is remarkably advancing, and these parts and devices are becoming widespread. Display apparatuses utilizing parts and devices related to image displays are becoming significantly widespread and used for television apparatuses, monitor apparatuses of personal computers, and the like. Also, display apparatuses are becoming both larger and thinner.

Plasma display panel (PDP) apparatuses are generally gaining popularity as next-generation display apparatuses to simultaneously satisfy a trend of becoming larger, and of becoming thinner, when compared with cathode-ray tubes (CRTs) representing existing display apparatuses. The PDP apparatuses display images using a gas discharge phenomenon, and exhibit superior display characteristics such as display resolution, brightness, contrast, an afterimage, a viewing angle, and the like. Also, since the PDP apparatuses are generally seen as having the most appropriate characteristics for future high-quality digital televisions due to thin luminous display apparatuses of which enlargement is simpler than any other display apparatus, the PDP apparatuses are gaining popularity as display apparatuses and are replacing CRTs.

The PDP apparatus generates a gas discharge between electrodes by a direct current (DC) voltage or an alternating current (AC) voltage which are supplied to the electrodes, so that ultraviolet light is generated. Then, a phosphor is exited by the ultraviolet light, thereby emitting light.

However, the PDP apparatus has a defect in that an amount of emitted electromagnetic waves and near infrared light with respect to a driving characteristic is great, surface reflectivity of the phosphor is great, and color purity due to orange light emitted from neon (Ne), helium (He), or xenon (Xe) used as a sealing gas is lower than the CRT.

Therefore, the electromagnetic waves and the near infrared light generated in the PDP apparatus may have harmful effects on human bodies, and cause sensitive equipment such as wireless telephones, remote controls, and the like, to malfunction. In order to use the PDP apparatus, it is required to prevent emission of the electromagnetic waves and the near infrared light emitted from the PDP apparatus from increasing to more than a predetermined level. PDP filters having functions such as a shielding function against the electromagnetic waves, a shielding function against the near infrared light, a surface anti-glare function, enhancement of color purity, and the like, are used for shielding against the electromagnetic waves and the near infrared light while simultaneously reducing reflected light, and enhancing color purity.

The PDP apparatus is made of a panel assembly including a discharge cell where a gas discharge phenomenon occurs, and a PDP filter shielding the electromagnetic waves and the near infrared light. Since the PDP filter is equipped in a front unit of the panel assembly, transparency is required to simultaneously emit light and perform shielding functions.

External light may enter the panel assembly passing through the PDP filter in a condition that an outer surface is bright, i.e. in a bright room condition with the PDP apparatus according to the conventional art. Accordingly, an overlapping between incident light generated in the discharge cell of the panel assembly, and the external light entered passing through the PDP filter from the outer . surface occurs. Accordingly, a contrast ratio decreases in the bright room condition, and therefore screen display capacity of the PDP apparatus is deteriorated.

Also, when a separate light absorption pattern absorbing the external light is used to increase the contrast ratio, a problem is generated where brightness of the PDP apparatus decreases and the viewing angle decreases.

Therefore, an external light-shielding layer which can raise a contrast ratio in a bright room, enhance brightness, and increase a viewing angle is needed.

BRIEF SUMMARY

An aspect of the present invention provides an external light-shielding layer which can increase brightness, a viewing angle, and a contrast ratio in a bright room condition.

An aspect of the present invention also provides a display filter including an external light-shielding layer.

An aspect of the present invention also provides a display apparatus including a display filter.

Technical solutions of the present invention are not limited to the above technical solutions, and other technical solutions which are not described would be definitely appreciated from a description below by those skilled in the art.

According to an aspect of the present invention, there is provided an external light-shielding layer including: a base substrate comprising a transparent resin; and wedge-shaped light-shielding patterns spaced apart from each other in a surface of the base substrate at predetermined intervals, and made of a resin comprising a coloring agent having a concentration of about 0.5% to about 1.5% by weight.

According to another aspect of the present invention, there is provided a display filter including: a filter base; and the external light-shielding layer generated in the surface of the filter base.

According to still another aspect of the present invention, there is provided a display apparatus including: a panel assembly including a front substrate and a rear substrate which are coupled corresponding to each other and a plurality of cells between the front substrate and the rear substrate; and the display filter located corresponding to the front substrate of the panel assembly.

Details of other exemplary embodiments are included in brief description of the drawings.

Advantages and features of the present invention and methods of performing the advantages and features may be apparent with reference to appended drawings and following exemplary embodiments described in detail. However, the present invention is not limited to the exemplary embodiments disclosed below, and may be realized in various forms. The exemplary embodiments are provided to completely disclose the present invention and fully inform those skilled in the art of categories of the invention, and the present invention is defined by the categories of claims. Identical reference numerals refer to identical elements throughout a specification.

The display apparatus used for the present invention can be variously applied to large-size display apparatuses such as PDP apparatuses emitting light with lattice-patterned pixels, organic light emitting diode (OLED) apparatuses, field emission display (FED) apparatuses, and the like, small-size mobile display apparatuses such as a personal digital assistants (PDAs), display windows of small game devices, display windows of cellular phones, and the like, flexible display apparatuses, and the like. In particular, the display apparatus of the present invention may be efficiently applied to display apparatuses for outdoor applications having the strong external light, and display apparatuses installed indoors of public facilities. The present invention is described by using the PDP apparatus and the PDP filter used for the PDP apparatus for convenience of description, but the present invention is not limited thereto and can be applied to the above various display apparatuses and the display filters used for the display apparatuses.

BRIEF DESCRIPTION OF THE DRAWINGS

The above and/or other aspects and advantages of the present invention will become apparent and more readily appreciated from the following detailed description, taken in conjunction with the accompanying drawings of which.

DETAILED DESCRIPTION OF EMBODIMENTS

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

Figure 1:
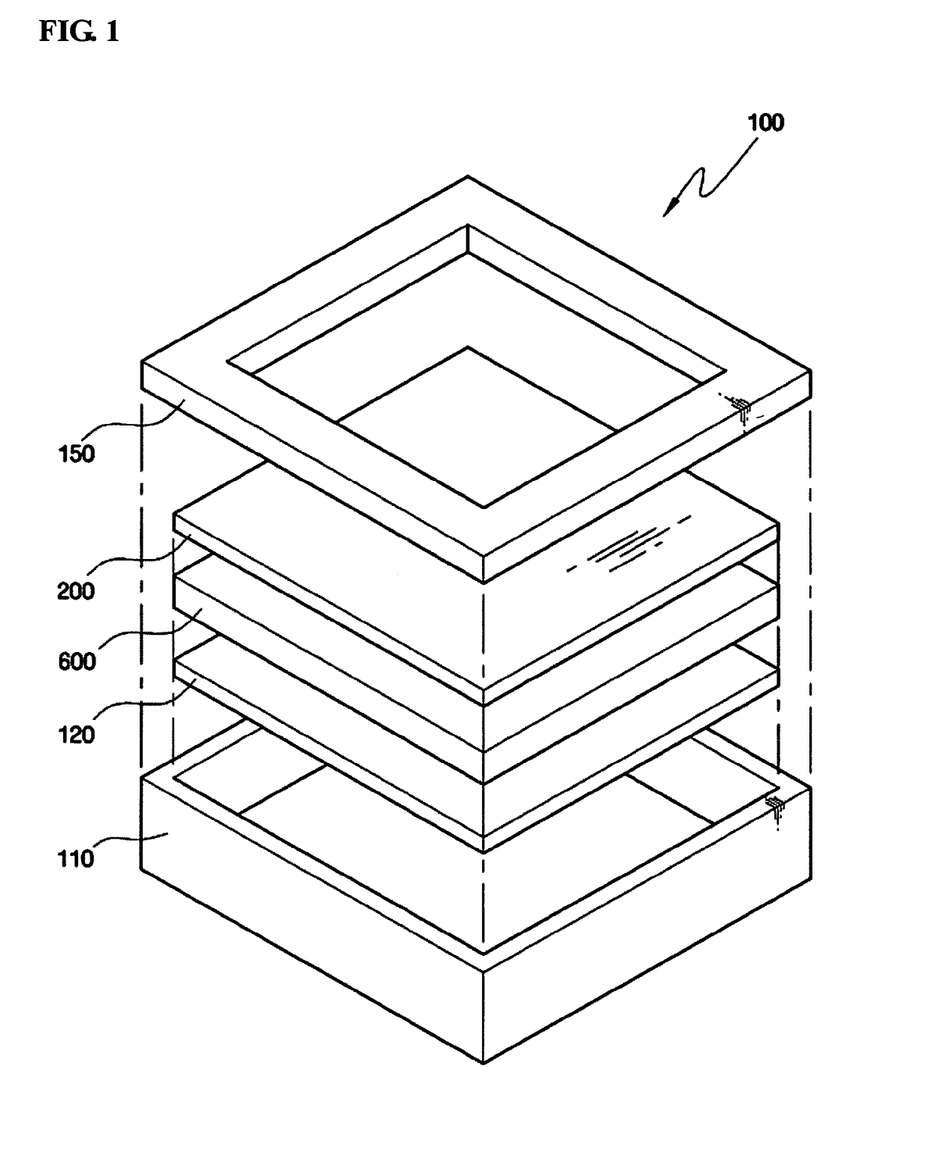
FIG. 1 is an exploded perspective view illustrating a plasma display panel (PDP) apparatus according to an exemplary embodiment of the present invention.

FIG. 1 is an exploded perspective view illustrating a plasma display panel (PDP) apparatus according to an exemplary embodiment of the present invention. A structure of the PDP apparatus 100 according to the exemplary embodiment of the present invention includes a case 110, a cover 150 covering an upper part of the case 110, a driving circuit board 120 received in the case 110, a panel assembly 600 including a discharge cell where a gas discharge phenomenon occurs, and a PDP filter 200, as illustrated in FIG. 1. The PDP filter 200 includes a conductive layer made of a material with high conductivity on a transparent substrate, and the conductive layer is earthed to the case 110 via the cover 150. Specifically, the electromagnetic waves generated from the panel assembly 600 are shielded by the cover 150 and the case 110 that are earthed using the conductive layer of the PDP filter 200, before reaching a viewer.

Hereinafter, the PDP filter 200 shielding the electromagnetic waves, the near infrared light, the external light, and the like is first described, and the PDP apparatus 100 including the PDP filter 200 and the panel assembly 600 is then described.

Figure 2:
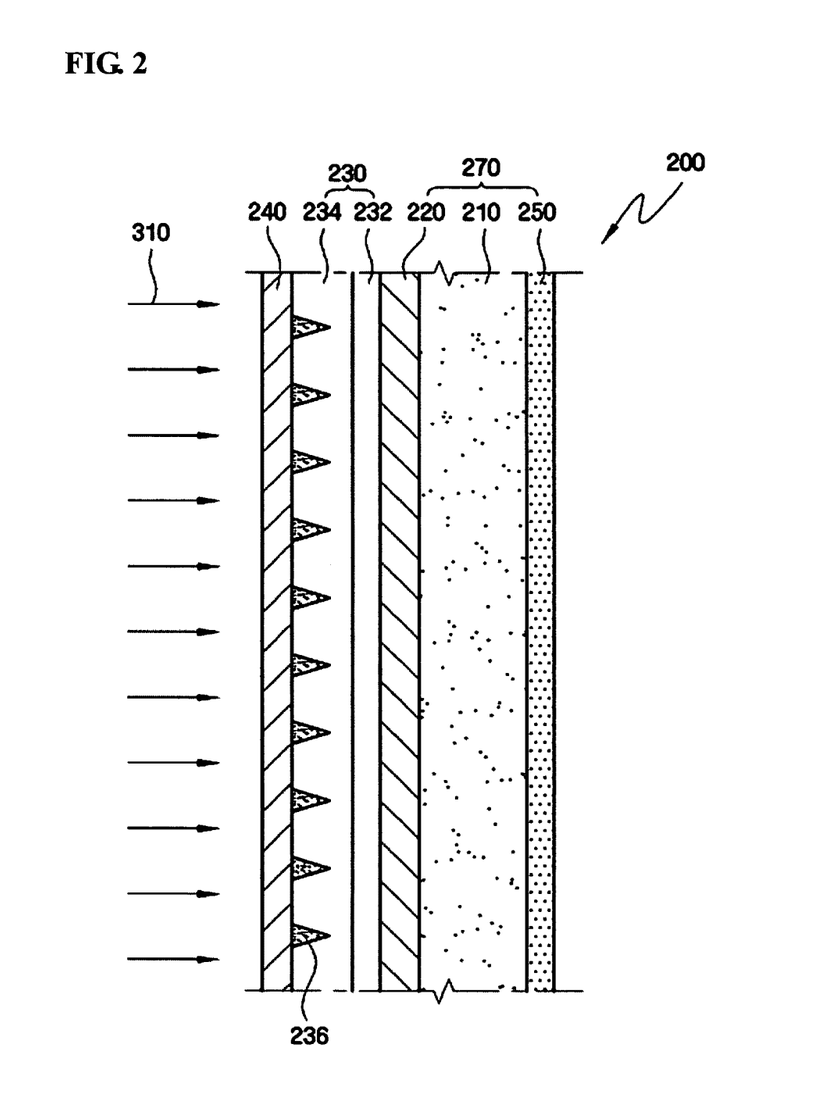
FIG. 2 is a sectional view illustrating a PDP filter according to an exemplary embodiment of the present invention.

FIG. 2 is a sectional view illustrating a PDP filter according to an exemplary embodiment of the present invention. As illustrated in FIG. 2, the PDP filter 200 according to the exemplary embodiment of the present invention includes a filter base 270 and an external light-shielding layer 230. The filter base 270 includes transparent substrate 210 and various layers having shielding functions, and the like are disposed on the transparent substrate 210.

Here, the filter base 270 is formed by stacking the transparent substrate 210, an antireflective layer 250, or a shielding layer against electromagnetic waves 220 regardless of order. Hereinafter, layers corresponding to an electromagnetic shielding function and an antireflection function are described as separate layers in the exemplary embodiment of the present invention, but the present invention is not limited thereto. Specifically, the filter base 270 according to the exemplary embodiment of the present invention may be configured of at least one layer, and each layer may have the electromagnetic shielding function, the antireflection function, or a combination thereof. Also, the filter base 270 may altogether have the above electromagnetic shielding function, the above antireflection function, or a combination thereof, and have any one of the electromagnetic shielding function, the antireflection function, or a combination thereof.

The external light-shielding layer 230 is disposed on a surface of the filter base 270. The external light-shielding layer 230 of the exemplary embodiment illustrated in FIG. 2 is disposed on a surface of the filter base 270, i.e. an opposite surface of a viewer position when the PDP filter 200 is installed in the PDP apparatus, but the present invention is not limited thereto, and the same functions and effects can be also obtained when the external light-shielding layer 230 is disposed on another surface of the filter base 270.

The external light-shielding layer 230 includes a supporter 232, a base substrate 234 formed on a surface of the supporter 232, and a light-shielding pattern 236 which is formed in the base substrate 234 and shields the panel assembly from external light entering from an outer surface. The light-shielding pattern 236 in the exemplary embodiment of the present invention includes a wedge-shaped black stripe.

Here, the base substrate 234 where the light-shielding pattern 236 is formed may be directly formed in the filter base 270, but the base substrate 234 may be combined with the filter base 270 after forming the base substrate 234 on the supporter 232, as illustrated in FIG. 2. The supporter 232 supports the base substrate 234 where the light-shielding pattern 236 is formed. The base substrate 234 and the surface of the filter base 270 are combined via the supporter 232 in the exemplary embodiment illustrated in FIG. 2, but the present invention is not limited thereto. Specifically, since the supporter 232 has a purpose of supporting the base substrate 234, the base substrate 234 and the filter base 270 may be directly combined when the external light-shielding layer 230 is disposed on another surface of the filter base 270.

In the exemplary embodiment of the present invention, it is desirable that the supporter 232 is a transparent resin film transparent to the ultraviolet light. A polyethylene terephthalate (PET), a polycarbonate (PC), a polyvinyl chloride (PVC), and the like may be used for a material of the supporter 232. Also, a layer having a characteristic function of a filter such as the antireflective layer 250, the shielding layer against the electromagnetic waves 220, and the like may be used for the supporter 232.

Also, the light-shielding pattern 236 is formed in a row on the surface of the base substrate 234 corresponding to the panel assembly (not illustrated), and prevents the external light from entering an inside of the panel assembly.

The base substrate 234 is made of an ultraviolet light-curable resin, and the light-shielding pattern 236 may be made of black inorganic/organic materials capable of absorbing light, and a metal. In particular, since electric conductivity is high, i.e. electric resistance is low in the case of using the metal, the electric resistance according to concentration of the metal powder may be controlled when forming the light-shielding pattern 236 by adding metal powder. Accordingly, the light-shielding pattern 236 may perform the electromagnetic shielding function. Furthermore, in the case of using a surface-blackened metal or a black metal (referred to as a "black metal"), the light-shielding pattern 236 may efficiently perform the external light-shielding function and the electromagnetic shielding function. Also, a resin including a coloring agent such as carbon black, acetylene black, aniline black, black metal, and the like may be used for the light-shielding pattern 236. Here, the ultraviolet light-curable resin, a thermosetting resin, and the like, may be used for the resin including the coloring agent.

The light-shielding pattern 236 of the present invention may be formed by a roll molding method, a heat press method of using a thermoplastic resin, an injection molding method in which a thermoplastic or thermo-curable resin is filled into the base substrate 234, and the like. Also, when the ultraviolet light-curable resin forming the base substrate 234 has the antireflection function, the electromagnetic shielding function, a color calibration function, or any combination thereof, the external light-shielding layer 230 may additionally perform the above functions.

Figure 3:
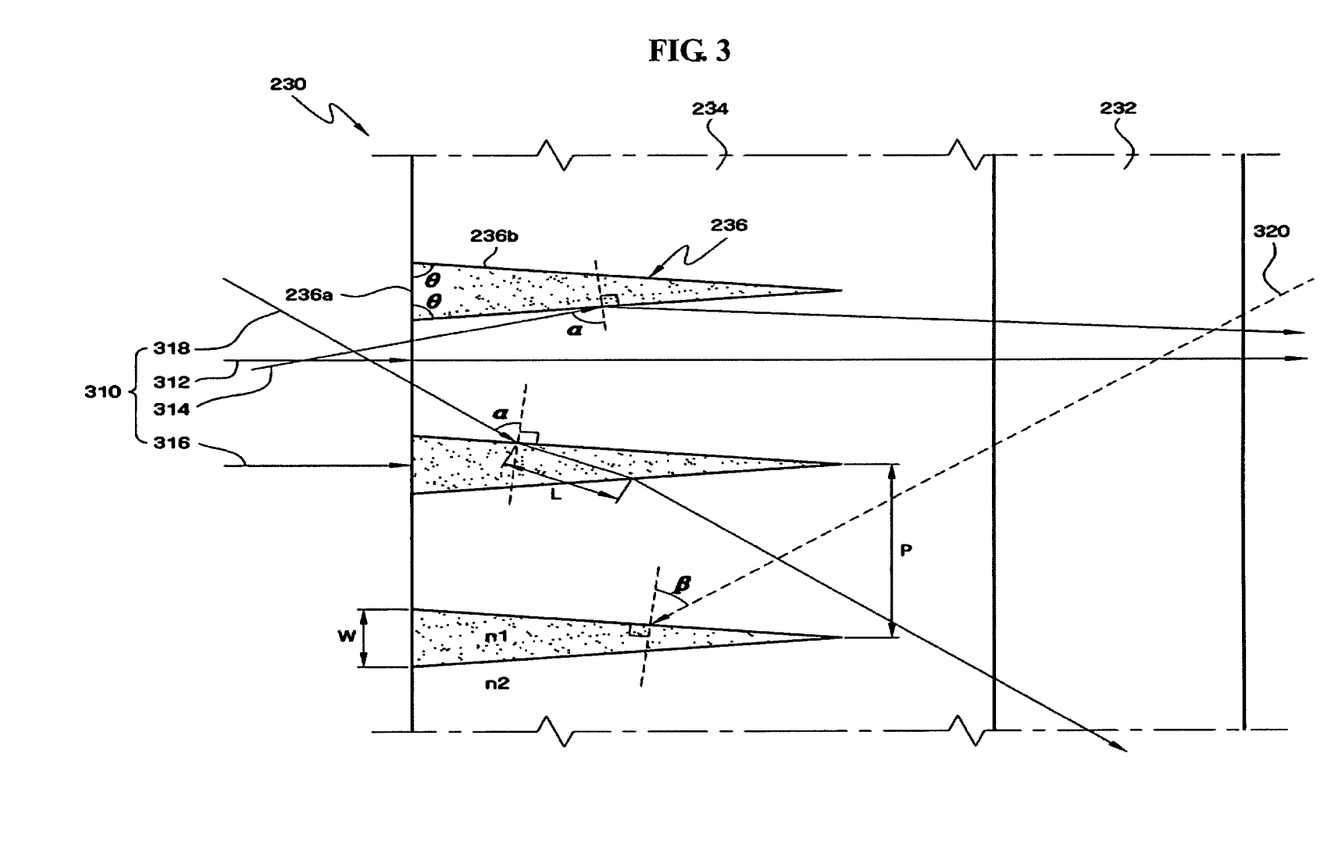
FIG. 3 is an enlarged sectional view illustrating an external light-shielding layer of FIG. 2.
Figure 4:
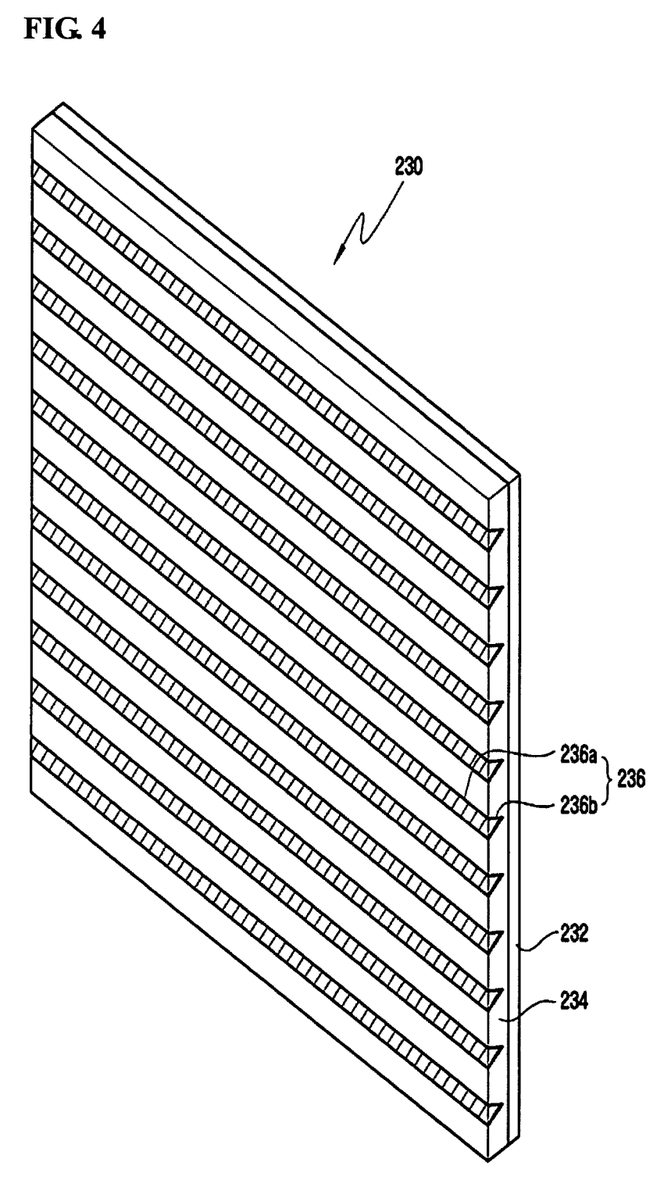
FIG. 4 is a perspective view illustrating the external light-shielding layer of FIG. 3.

Hereinafter, referring to FIG. 3 and FIG. 4, the external light-shielding layer 230 of the present exemplary embodiment is described in detail. FIG. 3 is an enlarged sectional view illustrating the external light-shielding layer 230 of FIG. 2. FIG. 4 is a perspective view illustrating the external light-shielding layer 230 of FIG. 3.

As illustrated in FIG. 3, the external light-shielding layer 230 may be shaped as black stripes, and a section may have a wedge-shape. As described with reference to FIG. 2, the external light-shielding layer 230 includes the supporter 232, the base substrate 234 formed on a surface of the supporter 232, and the light-shielding patterns 236 which are arranged in parallel on the surface of the base substrate. Here, the light-shielding pattern 236 includes a bottom surface 236a exposed to the outer surface of the base substrate 234, and an incline 236b forming a wedge-shaped groove in the base substrate 234 from the bottom surface 236a. Also, the incline 236b absorbs the external light 320, and totally reflects the incident light 310 from the panel assembly to the viewer.

A more specific description is given below, however, since the incline 236b is significantly long in the section of the light-shielding pattern 236 illustrated in FIG. 3 when compared with the bottom surface 236a, the PDP filter 200 of the present invention may have a high transmittance and a high contrast ratio with respect to visible light with a form of the light-shielding pattern 236 and a configuring material, when compared with the conventional PDP filter, regardless of whether the bottom surface 236a of the light-shielding pattern 236 faces the panel assembly or the viewer.

Also, when the bottom surface 236a of the light-shielding pattern 236 faces the panel assembly, average incidence angle of the incident light 310 is greater than average incidence angle of the external light 320 with respect to the incline 236b. Accordingly, the incident light 310 totally reflects on the incline 236b and increases the transmittance, and the external light 320 is absorbed in the incline 236b and increases the contrast ratio. Therefore, the PDP apparatus having better screen characteristics may be obtained. Hereinafter, an exemplary embodiment of the present invention when using the external light-shielding layer 230 where the bottom surface 236a of the light-shielding pattern 236 faces the panel assembly is described in detail.

An angle of inclination ($\theta$) which the bottom surface 236a and the incline 236b of the light-shielding pattern 236 form is within the range of about 80° through about 89°. Two inclines 236b forming a wedge-shaped groove are symmetrically and identically formed with each other, and are asymmetrically formed with each other within the range of the angle of inclination ($\theta$) corresponding to about 80° through about 89°.

Since the light-shielding pattern 236 is made of the light absorbing material, the external light 320 is mostly absorbed in the incline 236b of the light-shielding pattern 236, as long as the external light 320 is not vertically incident on the external light-shielding layer 230, as illustrated in FIG. 3.

The external light-shielding layer 230 including the light-shielding pattern 236 absorbs the external light 320, prevents the external light 320 from entering the panel assembly, and totally reflects the incident light 310 from the panel assembly to the viewer.

Specifically, the light-shielding pattern 236 includes the bottom surface 236a exposed to the outer surface of the base substrate 234, and the incline 236b forming the wedge-shaped groove in the base substrate 234 from the bottom surface. Also, the bottom surface 236a absorbs the incident light 316 emitted from the panel assembly, and the incline 236b totally reflects the incident light 314 emitted from the panel assembly to the viewer, and absorbs the external light 320.

When a function of the bottom surface 236a of the light-shielding pattern 236 is described, the incident light 310 emitted from the discharge cell of the panel assembly is mostly incident to a vertical direction with respect to the external light-shielding layer 230, and some incident light 316 is absorbed in the bottom surface 236a of the light-shielding pattern 236. It is desirable that the PDP apparatus generally has the high transmittance with regard to the visible light, and the high contrast ratio. Here, the contrast ratio may be shown as Equation 1.

$$\text{contrast ratio} = \frac{\text{brightness of (white light + reflected light)}}{\text{brightness of (black light + reflected light)}} \quad \text{[Equation 1]}$$

When the light emitted from the panel assembly is allowed to pass through the PDP filter without filtration to increase the transmittance of the PDP apparatus, both the brightness of white light and the brightness of black light are increased. Therefore, when the brightness of the PDP apparatus is increased, the whole contrast ratio is relatively decreased. A conventional PDP apparatus adopts a method of using a PDP filter including a black colorant-containing color correction film, and increasing the contrast ratio instead of reducing the transmittance of the PDP filter to a certain degree. To obtain the contrast ratio of about 120:1 in the case of using the conventional PDP apparatus, a visible light transmittance is required to be reduced to about 40%. The PDP filter 200 of the present invention uses the light-shielding pattern 236 absorbing light instead of using the black colorant-containing color correction film. Here, the bottom surface 236a of the light-shielding pattern 236 partially absorbs the incident light 310, controls the visible light transmittance of the panel assembly, and increases the contrast ratio of the PDP apparatus.

When an area ratio of the bottom surface 236a of the light-shielding pattern 236 to the surface of the base substrate 234 corresponds to about 20% to about 50%, the maximum contrast ratio may be obtained by the minimum transmittance loss. It is more desirable that greater effects can be obtained, when the area ratio of the bottom surface 236a of the light-shielding pattern 236 to the surface of the base substrate 234 corresponds to about 25% to about 35%. The PDP apparatus using the PDP filter 200 including the external light-shielding layer 230 may obtain a contrast ratio greater than or equal to about 250:1, when the visible light transmittance is maintained to be greater than or equal to about 50%.

Also, the external light-shielding layer 230 has the transmittance greater than or equal to about 70% in a visible spectrum. The incident light 310 from the panel assembly is mostly incident to a vertical direction with respect to the external light-shielding layer 230. Also, a portion of the incident light 316 of the incident light 310 from the panel assembly is absorbed in the bottom surface 236a, and another portion of the incident light 312 is directly transmitted through the base substrate 234, as described above. Also, still another portion of the incident light 314 is totally reflected from the incline 236b of the light-shielding pattern 236, facing the viewer, and therefore causes the transmittance of the PDP apparatus to be increased.

Complete reflection indicates that light is totally reflected on a boundary surface when the incidence angle is greater than a predetermined angle (a critical angle) in the case when light is incident from a medium where light is optically dense (a material with a high refractive index) to a medium where light is optically rare (a material with a low refractive index). Accordingly, the light-shielding pattern 236 is made of a light absorbing material, but the light-shielding pattern 236 may increase light transmittance of the PDP apparatus by totally reflecting the incident light 310 using the light-shielding pattern 236 where the refractive index is lower than the base substrate 234.

In the present exemplary embodiment, it is desirable that a difference of refractive indexes between the base substrate 234 and the light-shielding pattern 236 is less than or equal to about 0.05. As an example, when a refractive index (n2) of the base substrate 234 is 1.56, and a refractive index (n1) of the light-shielding pattern 236 is 1.55, a critical angle where complete reflection occurs is about 83.51°. Also, when a refractive index (n2) of the base substrate 234 is 1.56 (=arc sin(1.55/1.56)), and a refractive index (n1) of the light-shielding pattern 236 is 1.51, a critical angle is about 75.45° (=arc sin(1.51/1.56)). Therefore, when an incidence angle (α) with respect to the incline 234b is greater than or equal to about 75.45°, the incident light 314 illustrated in FIG. 3 is totally reflected on the incline 236b, faces the viewer, and increases the transmittance of the PDP filter 200.

As illustrated in FIG. 3, since the external light 320 such as a fluorescent lamp, sunlight, and the like, is generally located over the PDP apparatus, an incidence angle (β) of the external light 320 with respect to the incline 234b is less than the critical angle, and the external light 320 is mostly absorbed. Accordingly, the external light 320 may be prevented from entering the panel assembly, and the contrast ratio may be increased by reducing brightness of reflected light.

When the PDP filter 200 according to the exemplary embodiment of the present invention is installed in the PDP apparatus, both the high transmittance and the high contrast ratio may be obtained by utilizing the form of the light-shielding pattern 236 described above, regardless of a disposition direction of the light-shielding pattern 236. Also, similar to the description above, since the external light 320 such as the fluorescent lamp, sunlight, and the like is generally located over the PDP apparatus, the light-shielding pattern 236 absorbing the external light 320 may absorb the external light 320 more efficiently by horizontally disposing the light-shielding pattern 236 with respect to viewer, as illustrated in FIG. 4.

Figure 5A:
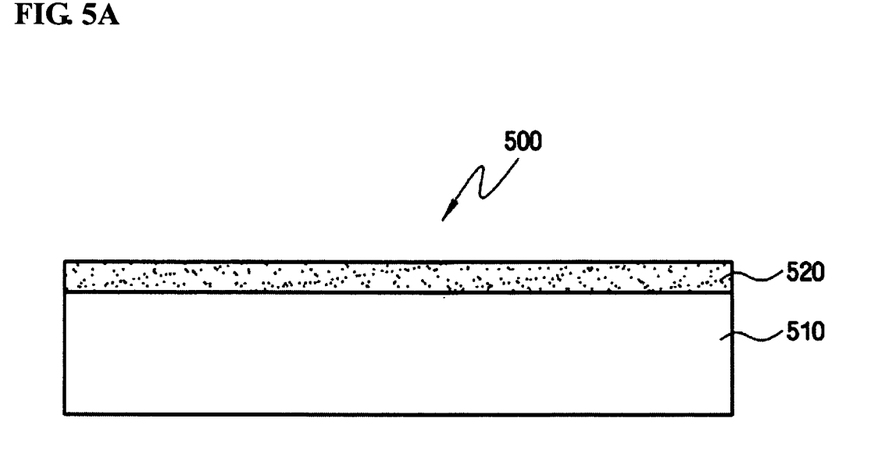
FIG. 5A is a sectional view illustrating a test sample for measuring a transmittance of a light-shielding pattern of FIG. 3.
Figure 5B:
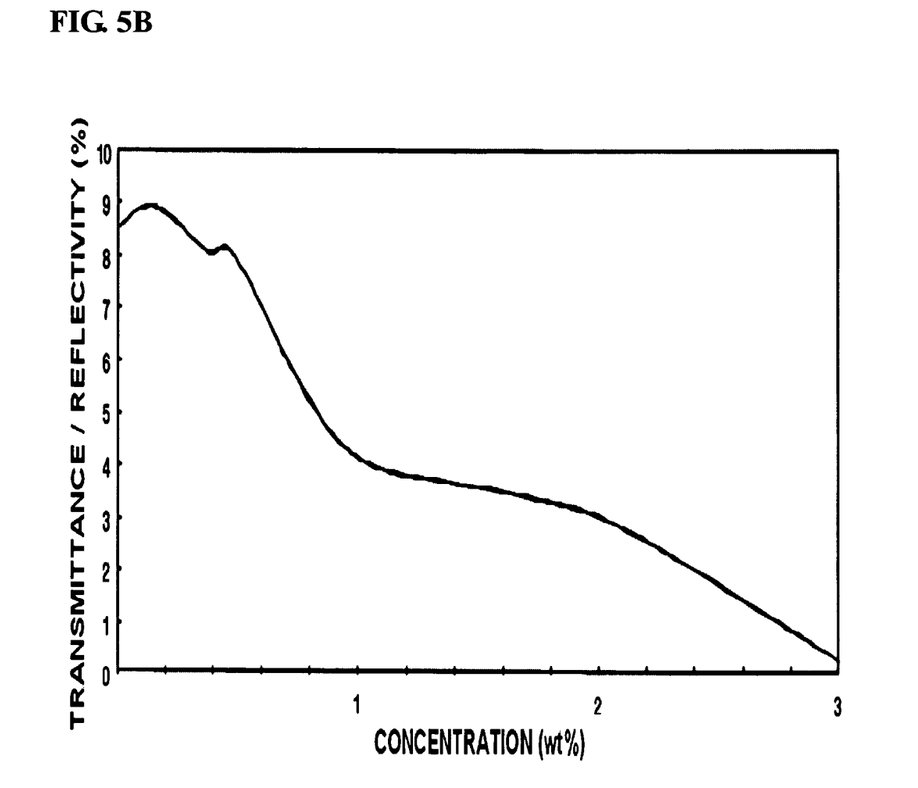
FIG. 5B is a graph illustrating a transmittance/reflectivity ratio measured according to concentration variation of a coloring agent included in the test sample of FIG. 5A.
Figure 5C:
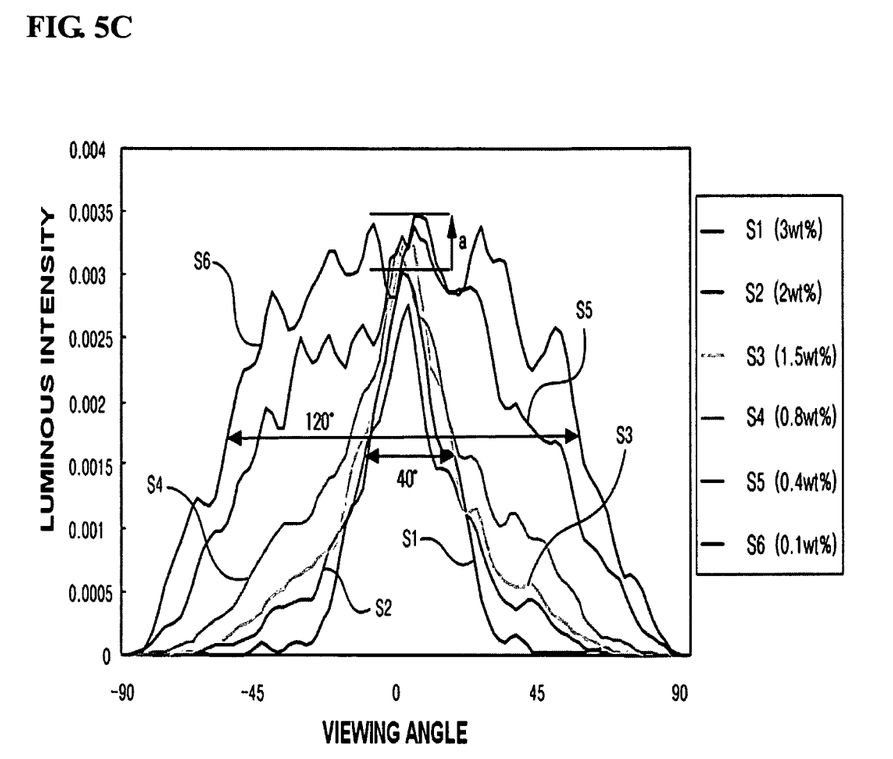
FIG. 5C is a graph illustrating a relation between a vertically-directed viewing angle and a luminous intensity of each external light-shielding layer after forming an external light-shielding layer using six test samples which concentrations of coloring agents are different.

Hereinafter, referring to FIG. 3 and FIGS. 5A through 5C, a PDP filter according to an exemplary embodiment of the present invention capable of increasing brightness and a viewing angle is described in detail. FIG. 5A is a sectional view illustrating a test sample for measuring a transmittance of a light-shielding pattern of FIG. 3. FIG. 5B is a graph illustrating a transmittance/reflectivity ratio measured according to concentration variation of a coloring agent included in the test sample of FIG. 5A. FIG. 5C is a graph illustrating a relation between a vertically-directed viewing angle and a luminous intensity with respect to the external light-shielding layer of FIG. 3.

The incident light 310 from the panel assembly is a kind of diffusion light sources, a portion of incident light 318 is refracted via the light-shielding pattern 236, or is absorbed in the light-shielding pattern 236 during refraction via the light-shielding pattern 236, as illustrated in FIG. 3. Specifically, when the incidence angle (α) of the portion of incident light 318 with respect to the incline 236b is greater than the critical angle, the incidence angle (α) no longer fulfills condition of total reflection, the portion of incident light 318 is mostly absorbed in the light-shielding pattern 236, and generates light loss. The light loss due to absorption and disappearance of light reduces overall brightness, limits distribution of luminous intensity, and thereby ultimately causes the viewing angle to be reduced.

It is required to modify the transmittance of the external light-shielding layer 230 in order that the portion of incident light 318 refracted without a total reflection on the light-shielding pattern 236 of the incident light 310 from the panel assembly may not be absorbed in the light-shielding pattern 236.

When the portion of incident light 318 which are incident on the light-shielding pattern 236 with various incidence angles (α) is not totally reflected, but the portion of incident light 318 is refracted via the light-shielding pattern 236, a length when the portion of incident light 318 passes through the light-shielding pattern 236 (hereinafter referred to as a "light path length (L)") is simulated. Here, as a result of modifying and simulating a pitch (P) between the light-shielding patterns 236, a width (W), an incidence angle (θ), the refractive index (n2) of the base substrate 234, and the refractive index (n1) of the light-shielding pattern 236, a light path length (L) of the portion of incident light 318 refracted via the light-shielding pattern 236 without a total reflection condition has a range of about 12 μm to about 20 μm.

To determine the transmittance and the reflectivity of the portion of incident light 318 with respect to the light-shielding pattern 236, a test sample 500 is prepared, as illustrated in FIG. 5A. The test sample 500 is made of a PET film 510, and a light-shielding film 520 made of the same material as the light-shielding pattern 236 on the PET film 510. Here, the light passing through the test sample 500, and the incident light 318 passing through the light-shielding pattern 236 are established in an identical environment by forming a thickness of the light-shielding film 520 to be the same as the light path length (L). In the present experimental example, the light-shielding film 520 is prepared by mixing a carbon black coloring agent in a polymethylmethacrylate (PMMA) resin for each concentration (wt %), and forming a wet coating in the PET film 510 with thickness of about 20 μm. In this instance, a ratio between the transmittance and the reflectivity with respect to six test samples (test samples S1 through S6) including the light-shielding film 520 where concentrations of coloring agents are about 3%, 2%, 1.5%, 0.8%, 0.4%, and 0.1% by weight is measured.

A transmittance of about 1% may be obtained with respect to the test sample S1 where a concentration of a coloring agent with respect to a visible spectrum is 3% by weight, a transmittance of about 21% may be obtained with respect to the test sample S2 in the case of 2% by weight, and a transmittance of about 30% may be obtained with respect to the test sample S3 in the case of 1.5% by weight. Also, a transmittance of about 48% may be obtained with respect to the test sample S4 in the case of 0.8% by weight, a transmittance of about 77% may be obtained with respect to the test sample S5 in the case of 0.4% by weight, and a transmittance of about 90% may be obtained with respect to the test sample S6 in the case of 0.1% by weight. Accordingly, it becomes apparent that the greater the concentration of the coloring agent included in the light-shielding film 520 is, the lower the transmittance of the visible light is.

Also, a graph of FIG. 5B is obtained by measuring the transmittance/reflectivity ratio (%) with respect to each test sample. As illustrated in FIG. 5B, a variation of the transmittance/reflectivity ratio is relatively small in the range where the concentration of the coloring agent included in the light-shielding film 520 corresponds to about 0.1% to about 0.5% by weight, or about 1.5% to about 3% by weight.

Here, referring to the external light-shielding layer 230 of FIG. 3, when the transmittance/reflectivity ratio of FIG. 5B is examined, brightness is great in the case where the concentration of the coloring agent is less than about 0.5% by weight, but since the external light 320 passes without being absorbed in the light-shielding pattern 236, the contrast ratio becomes low. Also, when the concentration of the coloring agent is greater than about 1.5% by weight, the external light 320 is absorbed in the light-shielding pattern 236, and therefore the contrast ratio may be increased. However, since the incident light 318 from the panel assembly is completely absorbed, the viewing angle is reduced.

Accordingly, when the concentration of the coloring agent included in the light-shielding pattern 236 corresponds to about 0.5% to about 1.5% by weight, brightness may be enhanced by increasing transmittance, and the contrast ratio and the viewing angle may also be increased.

FIG. 5C is a graph illustrating a relation between a vertically-directed viewing angle and a luminous intensity of each external light-shielding layer after forming an external light-shielding layer using six test samples (test samples S1 through S6) which concentrations of coloring agents are different.

As illustrated in FIG. 5C, a vertical viewing angle increases in a range of about 5° to about 50°, and luminous intensity increases as much as a predetermined amount (a), in the case of the external light-shielding layer where the concentration of the coloring agent corresponds to about 0.5% to about 1.5% by weight, compared with the external light-shielding layer where the concentration of the coloring agent corresponds to about 3% by weight.

Hereinafter, a filter base 270 illustrated in FIG. 2 is described in detail.

The filter base 270 according to the present exemplary embodiment has a multi-layered structure of the shielding layer against electromagnetic waves 220 on the surface of the transparent substrate 210, the antireflective layer 250 formed in the other surface of the transparent substrate 210, and the like. The present invention is not limited to a stacking order, and the filter base 270 may have the multi-layered structure regardless of order of the transparent substrate 210, the shielding layer against electromagnetic waves 220, or the antireflective layer 250.

Here, it is required to cover a display surface with a highly conductive material to shield the electromagnetic waves. A multi-layered transparent conductive film stacking a conductive mesh film, a metal thin film, and a transparent thin film having a high refractive index may be used for the shielding layer against electromagnetic waves 220 according to the exemplary embodiment of the present invention. In the present exemplary embodiment, the shielding layer against electromagnetic waves 220 is formed on the surface of the transparent substrate 210, i.e. a surface towards the panel assembly, but the present invention is not limited to the above disposition.

Even though it is not illustrated, the filter base 270 according to the exemplary embodiment of the present invention may separately include a shielding layer against near infrared light. The shielding layer against near infrared light is generated from the panel assembly, and shields the strong near infrared light causing electronic devices such as wireless phones, remote controls, and the like, to malfunction.

There is an effect that the multi-layered transparent conductive film shields the near infrared light, when the multi-layered transparent conductive film stacking the metal thin film and the transparent thin film having a high refractive index is used for the shielding layer against electromagnetic waves 220 according to the present exemplary embodiment. Accordingly, two functions of shielding the near infrared light and of shielding the electromagnetic waves may be simply performed with the shielding layer against electromagnetic waves 220 without separately forming the shielding layer against near infrared light. Also, the shielding layer against near infrared light described below may be separately performed in this case.

When the conductive mesh film is used for the shielding layer against electromagnetic waves 220 in the present exemplary embodiment, a resin with a high molecular weight, including a colorant absorbing the near infrared light which absorbs a wavelength of a near infrared light range, is used to shield the near infrared light emitted from the panel assembly. For example, an organic dye of various materials such as cyanine, anthraquinone, naphthoquinone, phthalocyanine, naphthalocyanine, dimonium, nickeldithiol, and the like, may be used for the colorant absorbing the near infrared light. Since the PDP apparatus emits the strong near infrared light extending over a wide wavelength range, the shielding layer against near infrared light absorbing near infrared light extending over the wide wavelength range may be used.

In the present exemplary embodiment, an electromagnetic shielding effect may be reduced in the case of using the transparent conductive film for the shielding layer against electromagnetic waves 220 more than in the case of using the conductive mesh film. However, when the electromagnetic shielding effect is complemented or strengthened by adding metal powder to black stripes 236, sufficient electromagnetic shielding effect may be simply realized with the transparent conductive film.

The antireflection layer 250 according to the present exemplary embodiment is formed on the other surface of the transparent substrate 210, but the present invention is not limited to the above built-up sequence. As illustrated in FIG. 2, it is desirably efficient that the antireflection layer 250 is formed in a surface corresponding to a viewer position, i.e. the opposite surface of the panel assembly. The antireflection layer 250 may enhance visibility by reducing reflection of the external light.

The PDP filter 200 according to the present exemplary embodiment may further include the color correction layer 240 having transmittance greater than or equal to about 60% in a wavelength range of about 580 nm to about 600 nm. The color correction layer 240 modifies or corrects color balance by reducing or controlling an amount of a red color (R), a green color (G), and a blue color (B).

A red visible light generated from plasma in the panel assembly is generally shown as an orange color. A conventional color correction layer generally plays a role of correcting the orange color having the wavelength range of about 580 nm to about 600 nm into the red color. However, the color correction layer 240 according to the exemplary embodiment of the present invention may reduce or exclude the role of correcting the orange color into the red color, due to the transmittance greater than or equal to about 60% with respect to the orange color in the wavelength range of about 580 nm to about 600 nm.

Since the light inherently emitted from plasma and the light that the external light is emitted being reflected from the panel assembly again are the orange color, the orange color is significantly emitted from the panel assembly. The PDP filter 200 according to the present exemplary embodiment may basically reduce an amount of the orange incident light by utilizing the external light-shielding layer 230, and preventing the external light 320 from entering the panel assembly. Accordingly, the PDP filter 200 of the exemplary embodiment may enhance color purity without additionally reducing an amount of the colorant used for correcting the orange color, or using the colorant. For example, when red, green, and blue colors (RGB) are established in middle image gradation (50 IRE) in a bright room (150 lux (1×)), color coordinates are sought with a measuring instrument with respect to each color, and an area ratio of measured color coordinates is sought, compared with an area concerning color coordinates of characteristic colors, it becomes apparent that high color purity may be obtained. The high color purity may be obtained due to an area ratio of about 86%, when measured via the PDP filter 200, compared with a fact that an area ratio of about 66% is obtained, when directly measured in the panel assembly.

The color correction layer 240 uses various colorants in order to increase a range of color reproduction of a display, and enhance distinction of a screen. Dyes or pigments may be used for the colorant. Types of colorants are organic colorants having a neon light shielding function such as anthraquinone, cyanine, azo, stilbene, phthalocyanine, methane, and the like, and the present invention is not limited thereto. Since kinds and concentrations of the colorants are determined by absorption wavelength, absorption coefficients, and transmittance characteristics required for displays, various numerical values may be used.

When each layer or each film of the PDP filter 200 is stuck together, a transparent gluing agent or adhesive may be used. As a specific material, there is an acrylic adhesive, a silicon adhesive, an urethane adhesive, a polyvinyl butyral adhesive (PMB), an ethylene-vinyl acetate adhesive (EVA), a polyvinyl ether, a saturated amorphous polyester, a melamine resin, and the like.

The PDP filter 200 of the present exemplary embodiment formed similarly to the description above may have the transmittance greater than or equal to about 50% in the visible spectrum, and have the contrast ratio greater than or equal to about 250:1 in a bright room.

The PDP filter 200 according to the exemplary embodiment of the present invention is described above. Hereinafter, a PDP apparatus using the PDP filter 200 is described.

Figure 6A:
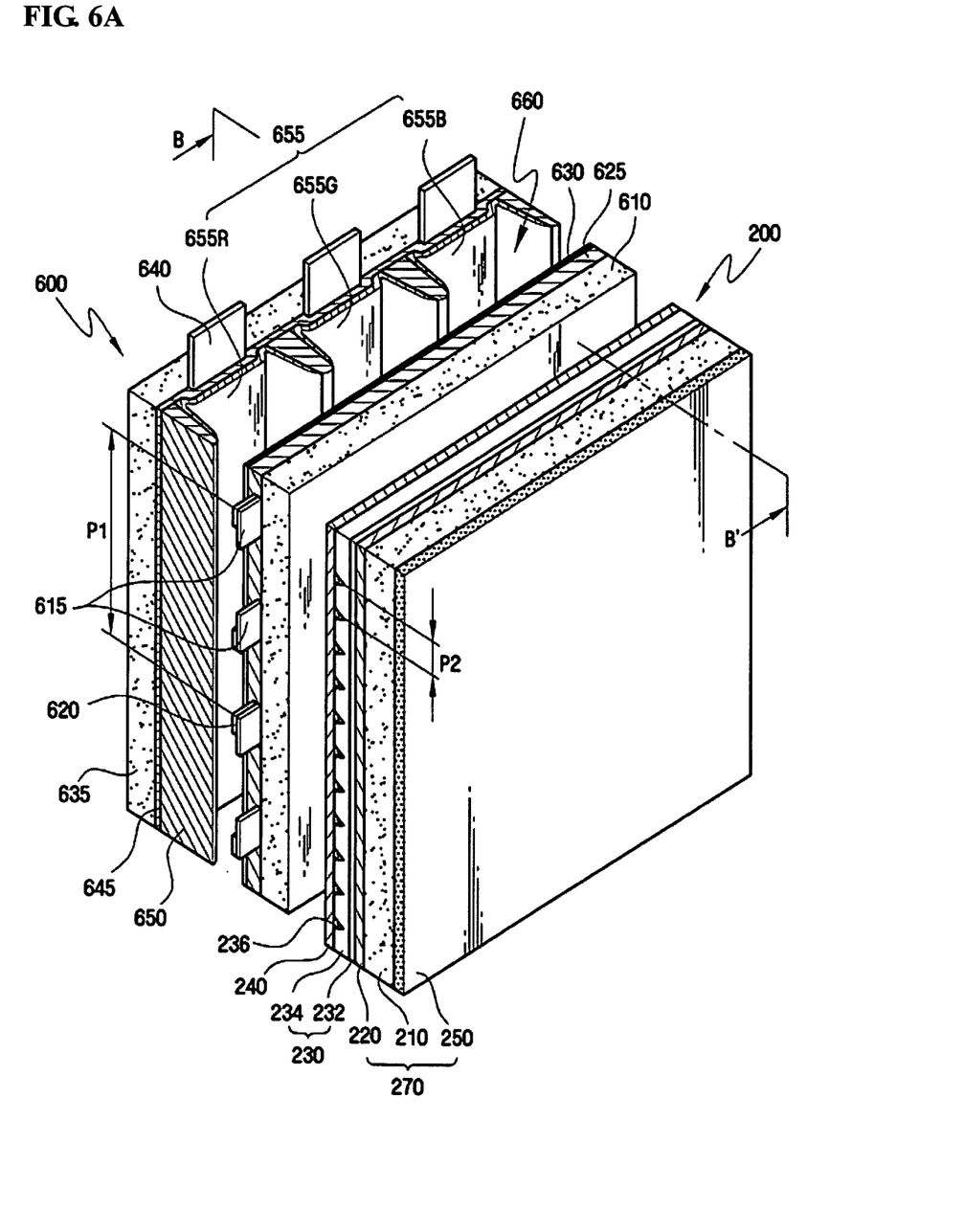
FIG. 6A is an exploded perspective view illustrating a PDP apparatus according to another exemplary embodiment of the present invention.

FIG. 6A is an exploded perspective view illustrating a PDP apparatus according to another exemplary embodiment of the present invention.

Figure 6B:
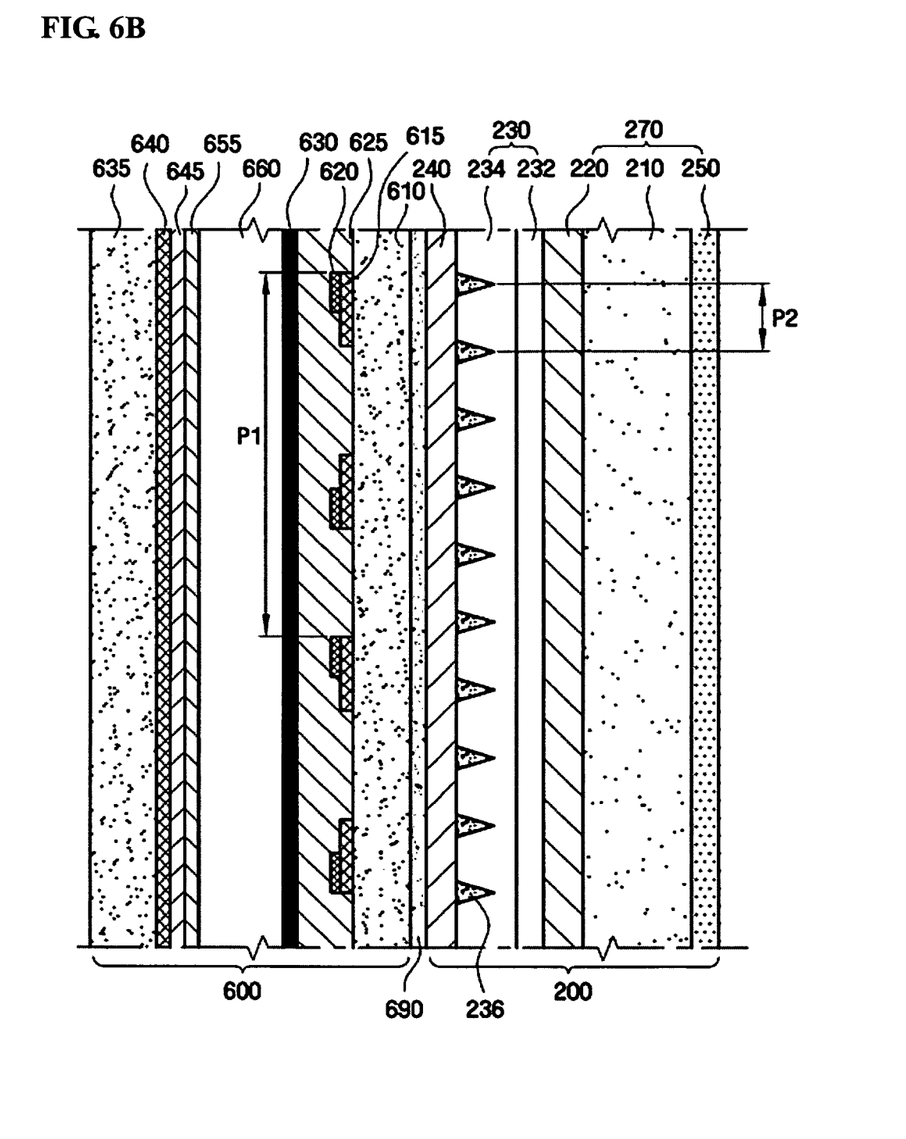
FIG. 6B is a sectional view illustrating a section incised along a line B-B' of FIG. 6A.

As illustrated in FIG. 6A and FIG. 6B, the PDP apparatus according to the exemplary embodiment of the present invention includes a PDP filter 200 and a panel assembly 600. The PDP filter 200 is similar to the above described PDP filter, and hereinafter, the panel assembly is described in detail.

As illustrated in FIG. 6A, a plurality of sustain electrodes 615 is disposed on a surface of a front substrate 610 in the form of stripes. A bus electrode 620 is formed in each sustain electrode 615 to reduce signal delay. A dielectric layer 625 is formed to cover the entire surface where the sustain electrode 615 is disposed. Also, a dielectric shielding film 630 is formed on the surface of the dielectric layer 625. As an example, the dielectric shielding film 630 in the present exemplary embodiment may be formed by covering a surface of the dielectric layer 625 with a thin film of magnesium oxide (MgO) using a sputtering method, and the like.

Also, a plurality of address electrodes 640 is disposed in the form of stripes on a surface of a rear substrate 635 corresponding to a front substrate 610. Disposition direction of the address electrode 640 is substantially in a perpendicular direction to the sustain electrode 615 when the front substrate 610 and the rear substrate 635 are disposed corresponding to each other. The dielectric layer 645 is formed to cover the entire surface where the address electrode 640 is disposed. Also, a plurality of partition walls 650 facing the front substrate 610 in parallel with the address electrode 640 is installed protruding on the surface of the dielectric layer 645. The partition wall 650 is disposed in a range between the neighboring address electrode 640 and the address electrode 640.

A phosphor layer 655 is disposed on a lateral surface and a bottom surface in a groove formed between two adjacent partition walls 650, and the dielectric layer 645. In the phosphor layer 655, a red phosphor layer 655R, a green phosphor layer 655, and a blue phosphor layer 655B are disposed in each groove divided by the partition walls 650. The phosphor layer 655 is a layer made of a phosphor particle group generated by using a method of generating a thick film such as a screen printing method, an ink-jet method, a photoresist film method, and the like.

For example, as material used for the phosphor layer 655, $(Y, Gd)BO_3$:Eu may be used for a red phosphor, $Zn_2SiO_4$:Mn may be used for a green phosphor, and $BaMgAl_{10}O_{17}$:Eu may be used for a blue phosphor.

When the front substrate 610 and the rear substrate 635 having the above structure are disposed corresponding to each other, discharge gas is sealed in a discharge cell 660 generated with the groove and the dielectric shielding film 630. Specifically, the discharge cell 660 is generated in each portion where the sustain electrode 615 between the front substrate 610 and the rear substrate 635, and the address electrode 640 cross in the panel assembly 600. For example, neon—xenon (Ne—Xe) gas, helium—xenon (He—Xe) gas, and the like may be used for the discharge gas.

The panel assembly 600 having the above structure basically having a function of emitting light similar to a fluorescent lamp, and the ultraviolet light emitted from the discharge gas according to internal discharge of the discharge cell 660 is converted into the visible light by exciting the phosphor layer 655 and emitting light.

Also, a phosphor material capable of conversing into each different visible light is used for the phosphor layer of each color (655R, 655C, and 655B) of each color used for the panel assembly 600. Accordingly, when the image is displayed in the panel assembly 600, color balance is controlled by controlling brightness of each phosphor layer (655R, 655G, and 655B). Specifically, brightness of other phosphor layers is reduced at a ratio predetermined for each color, based on the phosphor layer of the lowest color in brightness.

A driving method for the panel assembly 600 is generally divided into a drive for address discharge and a drive for sustain discharge. The address discharge occurs between the address electrode 640 and one sustain electrode 615, and wall charge is generated in this instance. The sustain discharge occurs due to a potential difference between two sustain electrodes 615 located in the discharge cell 660 where the wall charge is generated. The phosphor layer 655 of the corresponding discharge cell 660 is excited by the ultraviolet light generated from the discharge gas in the case of sustain discharge, and the visible light is emitted. Also, the visible light is exited via the front substrate 610, and generates the image that the viewer may recognize.

Hereinafter, referring to FIG. 6B, a relation between the panel assembly 600 and the PDP filter 200 is described.

As illustrated in FIG. 6B, the PDP filter 200 is disposed in an upper part of the front substrate 610 of the panel assembly 600. The PDP filter 200 is disposed being spaced apart from the front substrate 610 of the panel assembly 600, or contacting with the front substrate 610, as illustrated in FIG. 6A. Also, the PDP filter 200 and the front substrate 610 may be combined with the adhesive or a gluing agent 690 to prevent undesirable effects such as a foreign substance entering a space between the panel assembly 600 and the PDP filter 200, and the like, or reinforce self-strength of the PDP filter 200, as illustrated in FIG. 6B.

The external light-shielding layer 230 is formed in the PDP filter 200 to prevent the external light from entering the panel assembly 200. The external light is generally absorbed by the external light-shielding layer 230, and therefore it may be prevented that the external light is reflected again passing through the front substrate 610. Accordingly, the contrast ratio of the PDP apparatus may be enhanced in the bright room condition.

Also, since the visible light generated from the discharge cell 660 is connected using the total reflection occurring in the incline 236b of the light-shielding pattern 236, and is emitted into the outer surface, light loss may be reduced, and therefore brightness of the PDP apparatus may be enhanced.

As illustrated in FIG. 6B, it is desirable that a pitch (P2) between the light-shielding patterns 236 is smaller than another pitch (P1) of the discharge cell 660 formed in the panel assembly 600. Specifically, the incident light may be uniformly dispersed, and the external light may be efficiently absorbed by disposing a plurality of the light-shielding patterns 236 in one discharge cell 660.

Moire fringes may be generated by periodic patterns where the discharge cell 660 of the panel assembly 600 is formed, and periodic patterns where the light-shielding patterns 236 of the external light-shielding layer 230 are formed. The Moire fringes indicate interference fringes made when at least two periodic patterns are overlapped. It is desirable that the pitch (P2) between the light-shielding patterns 236 corresponds to about 70 μm to about 110 μm to prevent the Moire fringes.

According to the external light-shielding layer, the display filter including the external light-shielding layer and the display apparatus including the display filter of the present invention, brightness, the viewing angle, and the contrast ratio in the bright room condition may be increased.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. An external light-shielding layer for a display filter, the external light-shielding layer comprising:
a base substrate comprising a transparent resin; and
wedge-shaped light-shielding patterns spaced apart from each other on a surface of the base substrate at predetermined intervals, and made of a resin comprising a coloring agent, the coloring agent having a concentration of about 0.5% to about 1.5% by weight in the wedge-shaped light-shielding patterns,
wherein each of the wedge-shaped light-shielding patterns comprises a bottom surface exposed on one surface of the substrate and inclined surfaces extending from the bottom surface and forming a wedge-shaped groove in the substrate, and the bottom surface faces a side opposite to a direction from which an external light comes,
wherein a refractive index difference between the base substrate and the light-shielding patterns is less than or equal to 0.05,
wherein an area ratio of the bottom surface of the light-shielding patterns to the surface of the base substrate corresponds to about 20% to 50% and a contrast ratio is greater than or equal to about 250:1 when the visible light transmittance is maintained to be greater than or equal to about 50%.

2. The external light-shielding layer of claim 1, wherein an incident light on the external light-shielding layer is refracted via the light-shielding pattern without a total reflection in the light-shielding pattern, and passes through about 12 μm to about 20 μm of the light-shielding pattern.

3. The external light-shielding layer of claim 1, wherein the coloring agent is carbon black, acetylene black, aniline black, and black metal.

4. The external light-shielding layer of claim 1, wherein the external light-shielding layer has a transmittance greater than or equal to about 70% in a visible spectrum.

5. The external light-shielding layer of claim 1, wherein the external light-shielding layer is shaped as black stripes.

6. The external light-shielding layer of claim 1, wherein a pitch between the light-shielding patterns corresponds to about 70 μm to about 110 μm.

7. The external light-shielding layer of claim 1, wherein the light-shielding pattern has a lower refractive index than the base substrate.

8. A display filter comprising:
a filter base; and
the external light-shielding layer according to claim 1 generated in a surface of the filter base.

9. The display filter of claim 8, wherein the filter base has at least one of functions consisting of an antireflection, an electromagnetic shielding, a shielding of near infrared light, a color correction.

10. A display apparatus comprising:
panel assembly comprising a front substrate and a rear substrate which are coupled corresponding to each other and a plurality of cells between the front substrate and the rear substrate; and
the display filter of claim 8 located corresponding to the front substrate of the panel assembly.

11. A display apparatus comprising:
a panel assembly comprising a front substrate and a rear substrate which are coupled corresponding to each other and a plurality of cells between the front substrate and the rear substrate; and
a display filter located corresponding to the front substrate of the panel assembly, wherein:
the display filter comprises a filter base, and the external light-shielding layer according to claim 1 generated in a surface of the filter base, and
the display apparatus is a plasma display panel apparatus.

* * * * *